United States Patent [19]
Gordon et al.

[11] Patent Number: 5,747,814
[45] Date of Patent: May 5, 1998

[54] METHOD FOR CENTERING A LENS IN A CHARGED-PARTICLE SYSTEM

[75] Inventors: Michael Stuart Gordon, Somers; Paul F. Petric, Brewster, both of N.Y.

[73] Assignee: International Business Machines Corporation, Armonk, N.Y.

[21] Appl. No.: 761,170

[22] Filed: Dec. 6, 1996

[51] Int. Cl.⁶ .................................................. H01J 37/147
[52] U.S. Cl. .................. 250/398; 250/396 R; 250/492.2
[58] Field of Search .............................. 250/398, 396 R, 250/396 ML, 492.23, 492.2, 492.1, 492.22, 492.3

[56] References Cited

U.S. PATENT DOCUMENTS

| | | | |
|---|---|---|---|
| 4,393,310 | 7/1983 | Hahn | 250/398 |
| 4,445,041 | 4/1984 | Kelly et al. | 250/398 |
| 4,560,878 | 12/1985 | Knauer et al. | 250/398 |
| 4,618,766 | 10/1986 | van der Mast et al. | 250/311 |
| 4,788,425 | 11/1988 | Kobayashi | 250/311 |
| 5,243,191 | 9/1993 | Kobayashi | 250/311 |
| 5,258,617 | 11/1993 | Kaneyama et al. | 250/311 |
| 5,359,197 | 10/1994 | Komatsu et al. | 250/310 |
| 5,428,203 | 6/1995 | Kusunose | 219/121.25 |

OTHER PUBLICATIONS

Grooves, et al, "EL3 System for Quarter–Micron Electron Beam Lithography" J. Vac. Sci, Tech. (6), Nov./Dec., 1988, pp. 2028–2032.

Sturans, et al, "Optimization of Variable Axis Immersion Lens for Resolution and Normal Landing" J. Vac. Sci. Tech. (6) Nov./Dec. 1990, pp. 1682–1685.

Petric, et al, "EL–4 Column and Control" J. Vac. Sci. Tech. B, V. 11, #6, Nov./Dec. 1993, pp. 2309–2314.

Primary Examiner—Kiet T. Nguyen
Attorney, Agent, or Firm—H. Daniel Schnurmann

[57] ABSTRACT

A method for improving the alignment of an electron-beam through the optical axis of lenses in a lithographic system is described. The beam is nominally tilted through the center of the lens, and by using a plurality of deflectors the beam is pivoted through the center of the lens using a square wave toggle. The resolution of the beam is measured as it scans over a target, for both toggle states. The nominal tilt angle is chosen such that the resolution is identical for both toggle states. This technique does not rely on using an observation station, as it is common on TEMs, to view a magnified image of the specimen. Therefore, this technique can be used to align a beam that has been shifted off the optical axis, for instance, in a Variable-Axis-Lens lithography (VAL) system.

9 Claims, 5 Drawing Sheets

METHOD FOR CENTERING A LENS IN A CHARGED-PARTICLE SYSTEM

FIELD OF THE INVENTION

This invention relates to a method for improving the resolution of a charged-particle beam, and more particularly, to a method for aligning electron beam systems for integrated circuit lithography, electron microscopes, displays and the like.

BACKGROUND OF THE INVENTION

In transporting charged-particle beams, it is often necessary to steer or guide a beam through, e.g., beam-defining apertures, using magnetic deflection yokes or electric deflectors. In most charged particle systems, there is an alignment scheme that comprises either a single or multiple electric or magnetic deflectors. This invention applies to either electric or magnetic deflectors. Deflectors are generally referred to as "alignment coils" in the following context: when the alignment of a beam is performed in, e.g., a TEM (transmission electron microscope) or a lithographic system, either the voltage center or the current center must be brought into the middle of the viewing screen of the TEM or the lens of the lithographic system. Generally, when the accelerating voltage changes, images tend to wobble around a point, known as the target plane or 'target', in short. Accordingly, if the accelerating voltage varies, its effect can be minimized by adjusting the incident direction of the electron beam. This alignment will be referred, hereinafter, as a voltage center alignment. Similarly, when the excitation current supplied to the objective lens (or lenses) varies, the image will, likewise, wobble around a point. The incident direction of an electron beam with respect to an electron-optical lens is adjusted so that there is no motion in the final image when the excitation is adjusted. This method is referred to as a current center alignment.

Wobblers modulate the accelerating voltage or lens excitation, typically by means of a sinusoidal wave, triangular wave, saw-toothed wave, and the like. When a wobbler is in operation, the motionless center of the image can be clearly discerned. The center is brought into the middle of the final image (or lens), thereby achieving the necessary alignment.

Beam alignment methods, particularly, those falling broadly in the category of "wobbling while a beam is in motion" are known in the art and have been extensively described. By way of example, in U.S. Pat. No. 4,618,766 to van der Mast et al., an object placed in a TEM is illuminated from different angles and the resulting magnified image is digitally observed. Optimizing the beam alignment, focus, and the like, occurs when the motion of the beam is brought to a minimum. This method is not readily adaptable to an electron-beam lithography machine, since it relies on observing a magnified image of the specimen. Typical e-beam lithography machines do not have "observation stations" to view specimens.

U.S. Pat. No. 5,359,197 to Komatsu et al., describes a gun or a lens alignment algorithm for an SEM (Scanning Electron Microscope) in Filament Imaging mode for aligning the source and the Secondary Electron Image (SEI) mode in a lower lens of the electron beam column. Histograms are generated from the images and the position of the maximum is computed. The alignment is adjusted such that when the variables, e.g., the focus, the SEI mode, and the like, change, the maximum of the frequency spectrum does not move by more than a predetermined, allowed amount. Not addressed is the problem generated by the resolution degradation occurring when the beam is aligned to a particular lens, but is tilted with respect to it.

U.S. Pat. No. 5,243,191 to Kobayashi, describes a method for aligning a beam in a TEM, wherein a shift in the position of an image is recorded prior and after making an adjustment of either the accelerating voltage or the lens current. The shift is then mapped and the voltage and current centers are computed. This technique does not address maximizing the resolution of the beam by eliminating or reducing the aberrations caused by the tilt of the beam.

Although beam wobblers have been incorporated into TEMs and SEM's to facilitate alignment, practitioners of the art will readily appreciate that other aberrations may still be present even if perfect alignment is achieved. These aberrations vary as a power of the distance of the beam off the lens axis and/or the powers of the angle between the beam and the normal axis of the lens. By way of example, Kaneyama et al., in U.S. Pat. No. 5,258,617, describe a method for eliminating axial comma by adjusting the tilt of the beam after centering the voltage or the current center in the middle of the final image. The beam is tilted in both the positive and in the negative directions, in the X and Y axes, with the operator adjusting the tilt of the image until the positive and negative images have the same resolution (i.e., they look the same). This condition, which eliminates the axial comma aberration, minimizes the skillfulness required of an operator, in his quest for optimizing the alignment. This invention relies on processing the magnified transmission image of a specimen in a TEM and is, therefore, of limited utility in an electron beam lithography tool, since there is no magnification below the specimen. Transferring this method to lithography systems requires improvements of this method which are not described.

In regard to the previously mentioned wobbling of the excitation current of the lens, a better understanding of this method can be obtained by reference to FIGS. 1 and 2. Shown is a typical arrangement of electron optical components of a charged particle column which, in the present example, is comprised of a magnetic lens and beam alignment coils. A shaped electron beam (or charged-particle beam) that is used to write a pattern on a wafer (or mask) is depicted entering the lens off-axis. The beam can be centered at the lens by aligning it with either the upper or the lower alignment coils or with any combination of both the upper and the lower alignment coils. The deflectors will be referred to, hereinafter, as upper and lower, the notation referring to being closer or further away from the source of the electron beam.

FIG. 1 is a schematic diagram of a simplified beam of charged particles under current wobbling, showing the beam mis-centered in the lens and the resulting motion at the image plane. The beam's position at the target, observed by scanning the beam over the target, will shift when wobbling the lens excitation (i.e., the lens current) since the beam is not centered in the lens, as shown in the figure. In contradistinction, FIG. 2 illustrates a perfectly centered beam, wherein the excitation current wobbles, but no motion is detected at the target. This condition requires that the beam pass through the center, although this does not ensure that the electron-beam has any other relationship to the lens axis, such as its also being parallel to it, (e.g., if the beam is tilted as shown with respect to the optical axis). Even though the beam is tilted with respect to the optical axis, wobbling the lens excitation does not produce motion of the beam at the target.

Referring back to FIG. 1, a focussed electron-beam (or charged-particle) is shown emanating from 10 in a direction that is neither on, nor parallel to, the optical axis 20. An electron lens images the focussed beam onto the target plane 40, as shown by beam bundle 102. The lens 30 is schematically illustrated as a "light-optical" lens would be drawn. Of course, those skilled in the art will recognize that in charged-particle optics one could use this schematic representation to describe a magnetic lens or an electrostatic lens. Adjusting the focal length of the lens (by changing the current through a magnetic lens or the voltage for an electrostatic lens) causes the beam to be focussed at a position above (41) or below (42) the target plane 40. The resulting rays are shown by 103 and 101. A by-product of the beam being focussed at different planes is the resulting motion that occurs at the target.

In FIG. 2, the alignment of the beam is shown to have been changed by energizing the upper and lower alignment coils 110 and 120, respectively. One embodiment of this alignment is depicted by a beam that has been shifted parallel (telecentric), such that its angle with respect to the optical axis 20 remains fixed as it enters the lens 30 through the middle 50 of it. This is accomplished by energizing the upper alignment coil 110 with current to force the beam emanating from 10 to be deflected off the axis specified by 5, and shown by 11. Then, an equal and opposite current would be applied to the lower alignment coil 120 so that the beam appears to come from the axis specified by numeral 6, parallel to the axis 5. The absolute currents applied to the upper and lower alignment coils 110 and 120, respectively, are adjusted such that the beam enters the center 50 of the lens 30.

Although shown in FIG. 2 and described in one axis, it is clear that this procedure applies, likewise, to the orthogonal axes. As shown in the figure, and recognized as prior art, wobbling the lens (i.e, adjusting the focal length) does not shift the beam at the target 40. The only manifestation of the lens wobbling is that the beam goes in and out of-focus at the target.

U.S. patent application Ser. No. 08/356,433 describes how, in software, two orthogonal functions can be applied to a pair of alignment coils and the results superimposed. This can greatly aid in the alignment of a charged-particle beam. One can label the two functions "offset" and "tilt".

Again, referring more particularly to FIG. 2, the "offset" mode is used to deflect the beam parallel 6 to its original trajectory 5 by proper selection of the strength of the upper alignment coil with respect to the lower one, hereinafter referred as "offset ratio". The absolute current applied to the coils in the offset ratio, known as "offset gain", is used to position the beam at the center 50 of lens 30.

The variable axis lens principle was invented to maintain high resolution over larger deflection fields. In the general case of a variable axis lens (VAL), the beam is deflected off the optical axis above the lens, and the lens is shifted in synchronism with the deflection (by cancelling the radial component of the lens field). The variable axis immersion lens (VAIL) is a specific embodiment of the variable axis lens, wherein the target is immersed in the lens field. More details of this techniques can be found in the article by M. A. Sturans, et al. "Variable axis immersion lens (VAIL)", Microcircuit Engineering 83, H. Ahmed, J. R. A. Cleaver, G, A. C. Jones Editors, pp. 107–116, Academy Press, London, 1983.

In the variable axis lens system, the apparent lens center is shifted with respect to the physical center of the lens. The method of the present invention allows for aligning the beam into the center of the shifted lens to produce a nominal tilt angle of the beam with respect to the optical axis of the shifted lens. It further allows centering the beam to the shifted or non-shifted center of a variable axis lens, unlike the method described in the previously mentioned U.S. Pat. No. 5,258,617, which does not allow the lens to be shifted or to align the beam to the shifted lens.

OBJECTS OF THE INVENTION

Accordingly, it is an object of the present invention to provide a method for improving the alignment of an electron beam through the optical axis of lenses in a lithographic system.

It is yet another object of the invention to have the charged particle beam go through the center of the lens.

It is another object of the invention to set-up a charged particle column to ensure that the beam enters the lens along its optical axis, thereby impinging the specimen in a direction that is perpendicular to the target, taking full advantage of the aberrations present in electron lenses to aid in the setup.

It is still another object of the invention to have the alignment of an e-beam system apply to a system wherein direct observation of a magnified image of the specimen is not available.

It is a further object of the present invention to have the alignment of an e-beam system apply to any lens (including a variable axis immersion lens) system.

SUMMARY OF THE INVENTION

In accordance with one aspect of the present invention, there is provided a method for improving the resolution of a charged-particle beam lithographic system, the system having at least one alignment deflector for adjusting the incident angle of the beam scanning a target, the method including the steps of: aligning the beam into the center of a lens to produce a nominal tilt angle of the beam with respect to the optical axis of the lens; pivoting the beam about the center of the lens by a double deflection of the beam alignment; measuring the resolution of the beam while the beam scans across the target; applying a square wave toggle to the nominal tilt angle to generate a two-state pivot angle; and adjusting the nominal tilt angle until the resolution of the beam at the two states of the square wave toggle is identical.

In accordance with another aspect of the present invention, there is provided a method for improving the resolution of a variable axis lens (VAL) charged particle beam lithographic system, the system having a plurality of alignment deflectors, the method comprising the steps of: deflecting the beam off the lens optical axis and shifting the lens in synchronous with the deflection; aligning the beam into the center of the shifted lens to produce a nominal tilt angle of the beam with respect to the optical axis of the shifted lens; pivoting the beam about the center of the lens by a double deflection of the beam alignment; measuring the resolution of the beam while the beam scans across a target; applying a square wave toggle to the nominal tilt angle to generate a two state pivot angle; and adjusting the nominal tilt angle until the resolution of the beam at the two states of the square wave toggle is identical.

In accordance to a third aspect of the invention, there is provided a method for improving the resolution of a variable axis immersion lens (VAIL) charged particle beam lithographic system, the system having a plurality of alignment deflectors, the method comprising the steps of: deflecting the beam off the lens optical axis and shifting the lens in synchronous with the deflection; aligning the beam into the center of the shifted lens to produce a nominal tilt angle of the beam with respect to the optical axis of the lens; pivoting the beam about the center of the shifted lens by a double deflection of the beam alignment; measuring the resolution of the beam while the beam scans across a target; applying a square wave toggle to the nominal tilt angle to generate a two state pivot angle; and adjusting the nominal tilt angle until the resolution of the beam at the two states of the square wave toggle is identical.

BRIEF DESCRIPTION OF THE DRAWINGS

While the specification concludes with claims particularly pointing out and distinctly claiming that which is regarded as the present invention, details of preferred embodiments of the invention may be more readily ascertained from the technical description when read in conjunction with the accompanying drawings wherein:

DETAILED DESCRIPTION OF THE INVENTION

Figure 1:
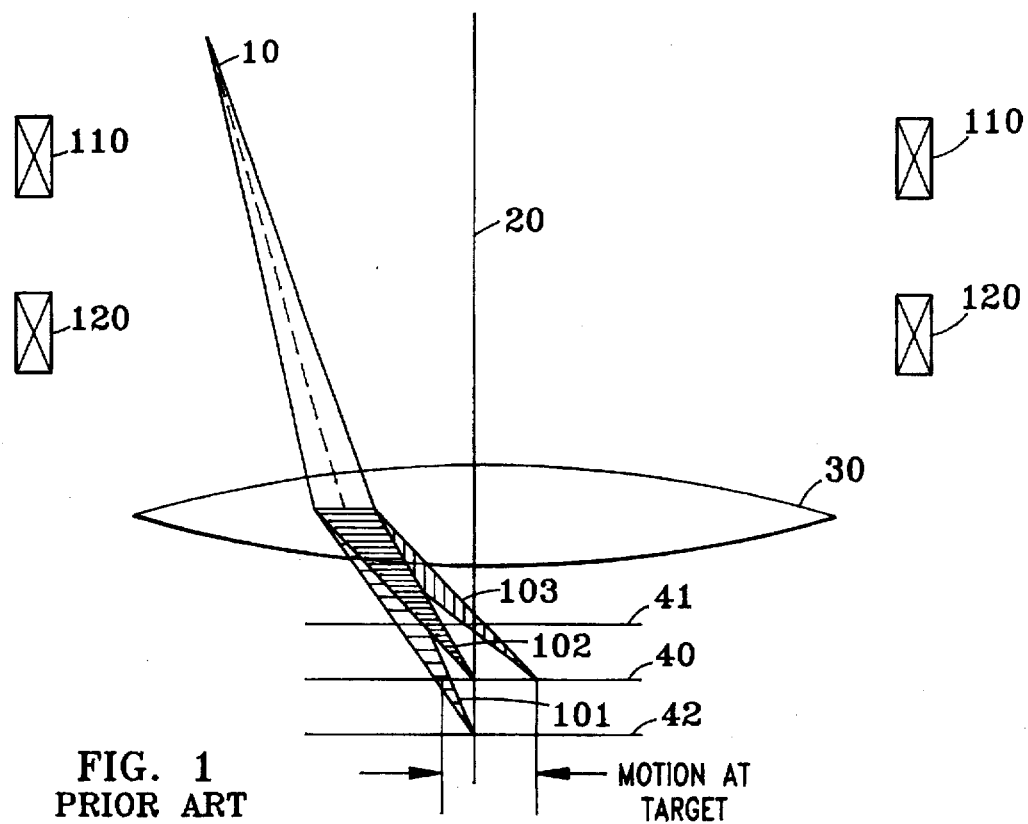
FIG. 1 is a schematic diagram of a prior art beam which is mis-centered in the lens, and motion results at the image plane when the excitation current of the lens is wobbled.
Figure 2:
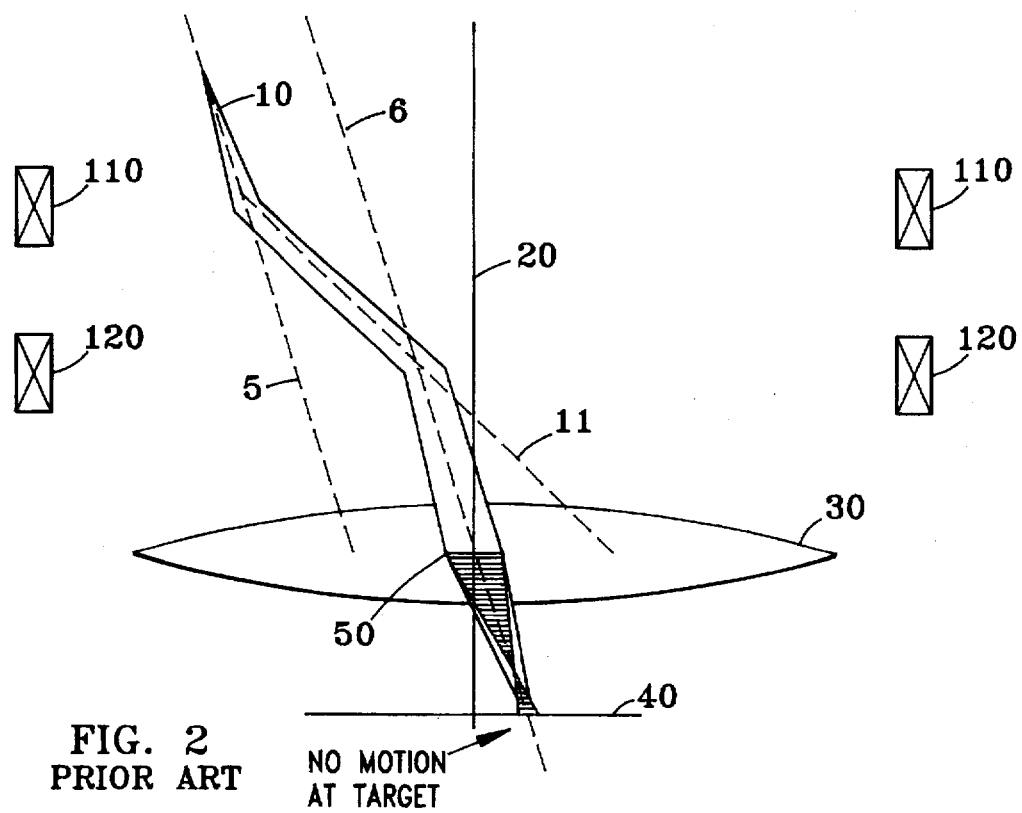
FIG. 2 is a schematic diagram of a prior art beam perfectly centered, with no motion of the beam at the target in the presence of a excitation current of the lens being wobbled.
Figure 3:
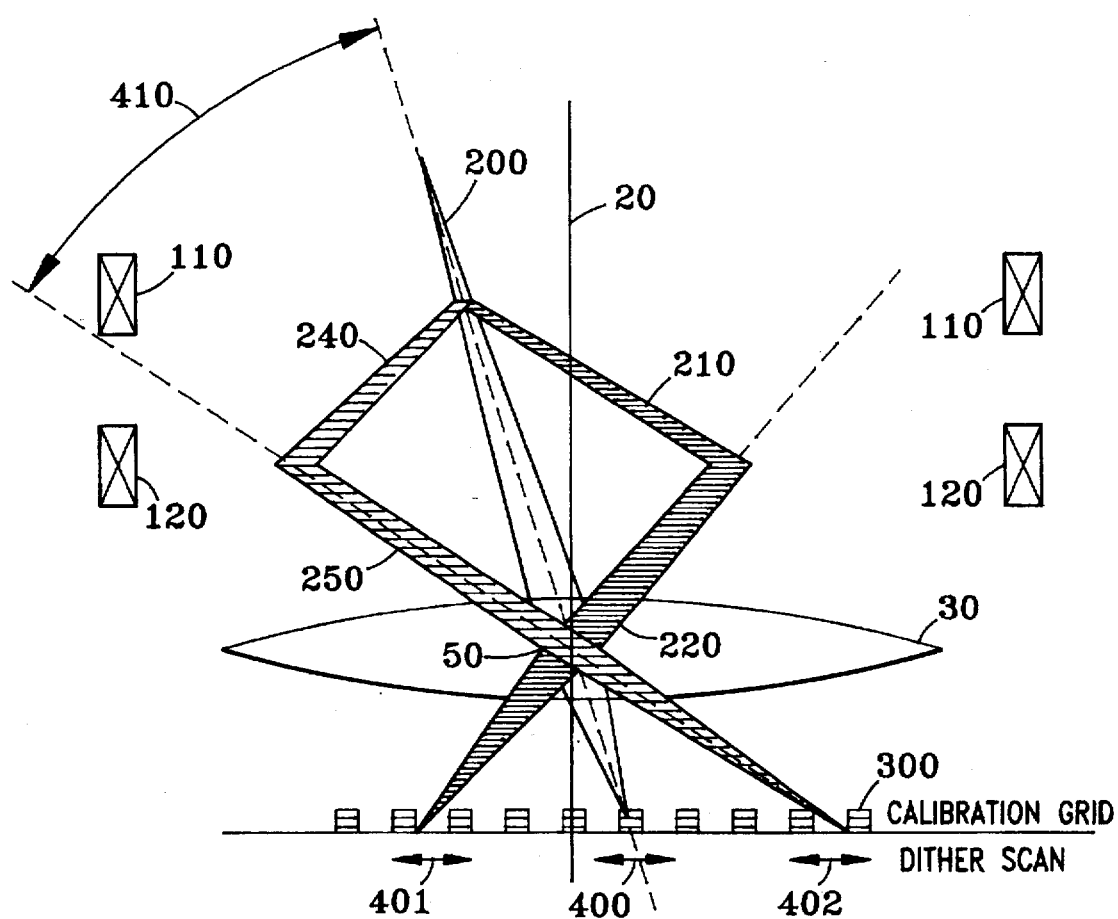
FIG. 3 shows a beam bundle that has been aligned by upper and lower alignment coils to go through the center of the lens, according to the present invention.

Referring now to FIG. 3, there is shown a beam bundle which has been aligned by the upper and lower alignment coils through the center 50 of the lens 30, with a nominal tilt angle of the beam 410 with respect to the optical axis 20 of the lens. The beam 200 is shown tilted with respect to the optical axis 20, but centered with respect to the electron lens 30. The centered beam can be deflected with the upper and lower alignment coils 110 and 120, such that it pivots about the center of the lens 30 using the "tilt" mode. The beam 200 is deflected off-axis by the upper alignment coil 110 (shown as 210), and then through the center of the lens 30 by the lower alignment coil 120 (shown as 220). The combination of the upper and lower alignment coils 110 and 120, respectively, provide alignment of the beam through double deflection. Practitioners of the art will fully appreciate that the beam 200 could be deflected to the other side of lens 30 as shown by 240 and 250, still pivoting about the center 50 of the lens 30. The offset and tilt modes are setup sequentially, e.g., the beam is deflected from axis 5 to axis 6 (FIG. 2), hitting the center 50 of the lens 30 before the tilt function is set to pivot the beam about the center of the lens.

Figure 4A:
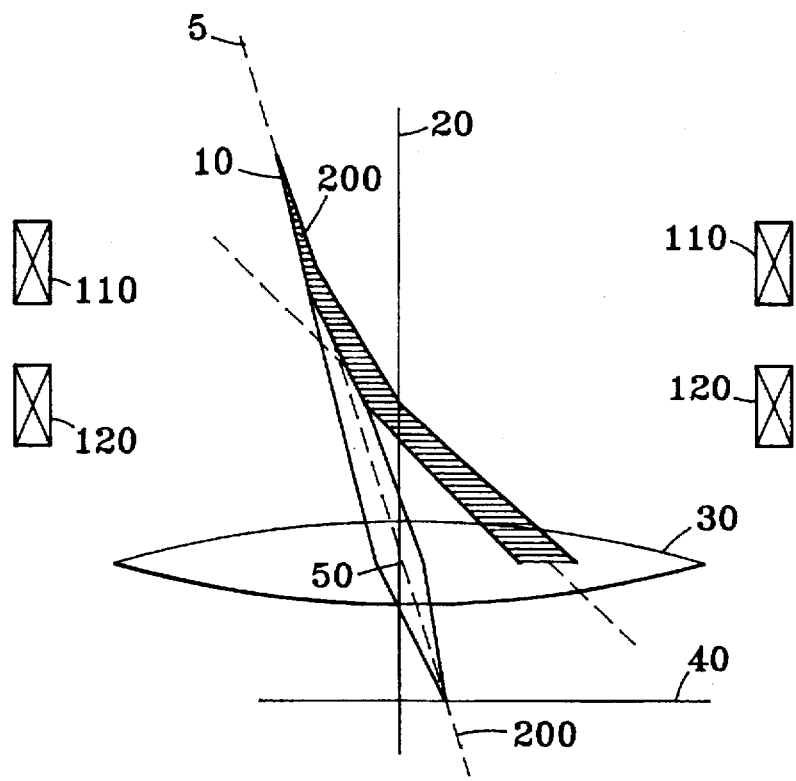
FIGS. 4a–4d illustrate the notion of alignment coil ratios.
Figure 4B:
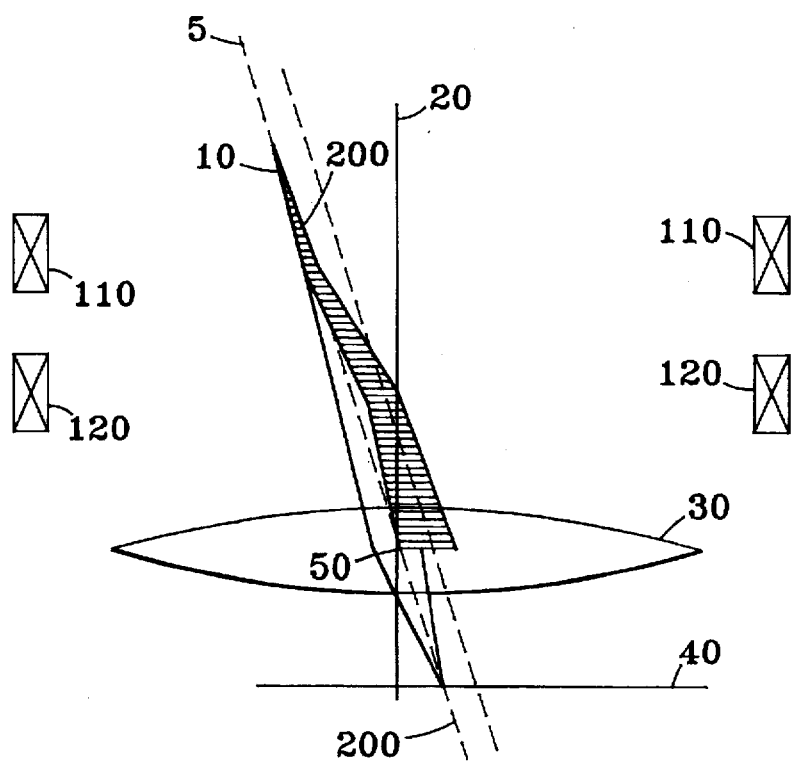
Figure 4C:
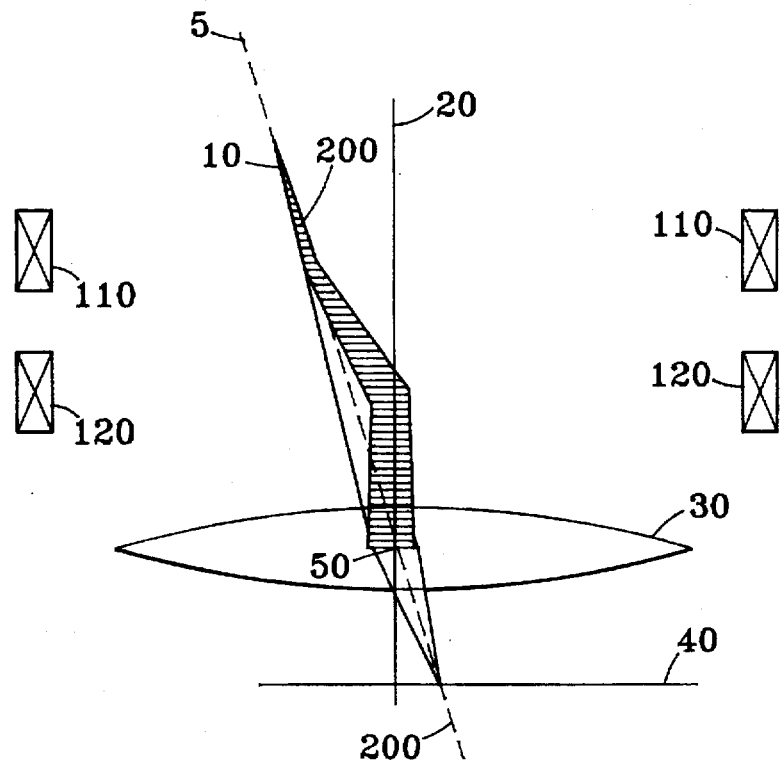
Figure 4D:
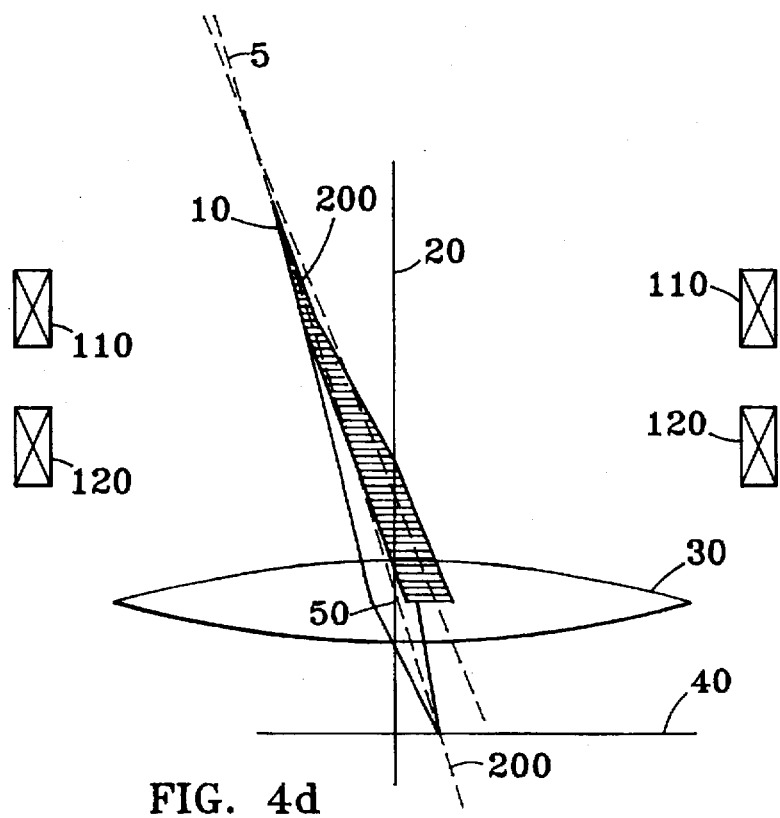

The relative strength of the upper and lower alignment coils, 110 and 120, respectively, required to pivot the beam about the center 50 of the lens 30, heretofore known as the "tilt ratio", can be determined by geometry. That is, knowing the distance between the upper and lower alignment coils 110 and 120, respectively, as well as the distance from either coil to the geometric center of the lens 30, the alignment coil ratio can be determined. A tilt ratio of (i.e., the ratio of currents applied to the upper and lower alignment coils).

upper/lower=1/1 results in the beam appearing to be deflected from the geometric center of the upper and lower alignment coils, as shown in FIG. 4a. A tilt ratio of upper/lower=+1/−1, as shown in FIG. 4b translates the beam in a direction parallel to itself. Other combinations of the tilt ratio can be imagined, as shown in FIGS. 4c and 4d, where the beam appears to be deflected from below the lower coil or from above the upper coil, respectively. As known in the prior art, for a ratio of upper/lower=(<1)/−1, the beam will be aligned as shown in FIG. 4c. For the case where the ratio is:

upper/lower=1/(>−1)

the beam will be aligned as shown in FIG. 4d.

Of course, the tilt ratio that pivots the beam about the center 50 of lens 30 (FIG. 3), can be finely tuned by ensuring that beam 200 remains centered at the lens as the amplitude of the upper and lower alignment coils 110 and 120, respectively, changes for a fixed tilt ratio.

A square-wave scan can be applied to the upper and lower alignment coils 110 and 120, respectively, for a tilt ratio determined as described above, to generate the alternating beam envelopes at the extremes of the pivoted deflection indicated by 210–220 and 240–250. As shown in FIG. 3, the offset ratio and offset gain are adjusted so that the beam enters lens 30 (FIG. 3), as shown by numeral 200. Then, the tilt function can be scanned to produce alternating bundles 210–220 and 240–250. Since the entrance angle 410 of the beam envelope 220 with respect to the optical axis 20 is smaller than that of 250, one would expect it to have a better edge resolution, i.e., smaller edge slope than 250, since many geometric aberrations dependent on this angle.

The intended objective is to adjust the entrance angle 410 of the central beam 200 such that it has on the optical axis 20, and bundles 220 and 250 (i.e., two-state pivot angle) will be focussed at the target plane with identical resolution. The proper tilt gain is the one that aligns beam 200 to the optical axis 20, i.e., the nominal tilt angle is adjusted until the resolution of the charged particle beam is identical for both states of the previously mentioned two-state pivot angle.

The previously described pivoting of the beam about the center of the lens can be extended to a VAL or a VAIL system by a double deflection of the beam alignment pivoting about the shifted optical axis of the lens.

In the prior art, it would have been necessary to view a magnified image of the target (specimen) in an observation station for determining the tilt needed to optimize the resolution of the beam.

An embodiment of this method that is useful for determining the exact tilt condition such that the beam lies along the optical axis involves simultaneously observing the resolution of the beam bundles 210–220 and 240–250 at the focal plane (target) and the adjustment of the beam tilt (using tilt gain) to achieve this condition.

Figure 5:
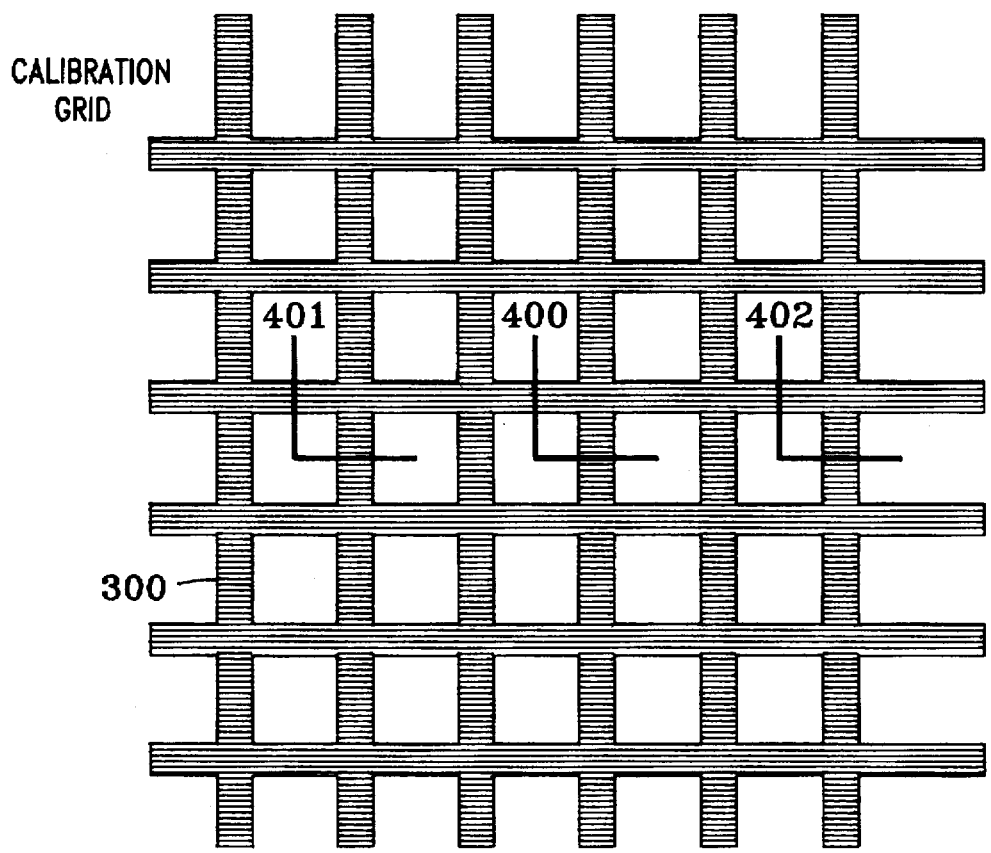
FIG. 5 illustrates a calibration target and signals generated by the beam scanning over the target.

Referring now to the calibration grid 300 shown in FIG. 3, or in more detail in FIG. 5, although it is not necessary for a successful implementation of this invention, the grid may be of a back-scatter or a transmission type. The back-scatter type consists of bars preferably made of gold, tungsten, or other heavy metals on a substrate of smaller atomic number, e.g., silicon. As the beam is scanned across the grid, a certain percentage of electrons that were incident on the grid are back-scattered with essentially the original beam energy. The number of back-scattered electrons is dependent on the atomic number of the material that the beam strikes.

Therefore, sufficient contrast is obtained between the bars and the substrate if the materials differ substantially in their atomic numbers. The back-scattered beam is detected using prior-art "diode" detectors. In contradistinction, a transmission grid looks like a wire mesh, e.g., the bars are opaque to the beam. The beam that falls through the holes of the grid can be detected by an electrometer or by other means of detection.

Consider a beam that is dithered (as shown by 400 in FIG. 3) over the calibration grid 300 either by a small, high speed scanning signal added to the alignment coils or used to drive another deflector (electric or magnetic). The differentiated back-scattered signal is displayed on a monitor as a function of the scan. The monitor display would show a positive-going of trace as the beam crosses one edge of the grid bar, and a negative going trace as it crosses the other edge (assuming that the beam is smaller than the width of the bar). The distance between the traces, the grid bar size, can be used to calibrate the scan. The width of either the positive-going or negative-going trace is the size of the beam. Depending on the size of the scan in relation to the periodicity of the grid, several grid bars may be scanned. Typical numbers are: a 2 µm² beam, an 18.75 µm grid periodicity and 2.5–5 µm wide bars.

A large amplitude, slow speed (relative to the dither scan) square-wave toggle can be applied to the upper and lower alignment coils 110 and 120, respectively, in the tilt ratio determined as described above, to generate the alternating beam envelopes at the extremes of the pivoted deflection indicated by 210–220 and 240–250. FIG. 5 shows a schematic representation of the calibration grid as well as the L-shaped dither signals at positions 400, 401 and 402 for beams 200, 210–220 and 240–250, respectively. The L-shaped dither allows the beam to be scanned across the calibration grid, using two axes perpendicular to each other, e.g., the cartesian x and y axes.

As the amplitude of the square-wave toggle scan is increased, more and more bars on the calibration grid are crossed, e.g., when the distance between positions 401 and 402 on the calibration grid 300 is increased. The amplitude needs to be large enough to discern a noticeably edge-slope (rise-time in the differentiated back-scatter signal) difference between the beam at positions 401 and 402. By finely tuning this amplitude (and frequency) of the toggle scan and the position of the calibration grid relative to positions 401 or 402, it is possible to view nearly simultaneously the differentiated back-scattered signal at positions 401 and 402. Therefore, scanning the beam over the target concurrently with toggling the nominal tilt angle enables the observation of the resolution of the two states of the nominal tilt angle simultaneously. It is therefore possible to make adjustments to the tilt gain (which changes the incident angle 410 as shown in FIG. 3) and view the resulting differences of edge slope in dither scans at positions 401 and 402. The correct alignment (tilt) is achieved when the beam edge slope is identical for dither scan at positions 401 and 402.

EXAMPLES

To demonstrate that the aforementioned method reduces overall aberrations and provides normal landing, the resolution of the beam can be measured for a variety of initial angles 410 between beam 200 and its optical axis 20, as shown in FIG. 3. Then, the landing angle can be determined in a conventional manner by measuring the spacing between fiducial marks on a large grid, at two different heights, and taking difference as a function of the height.

Figure 6A:
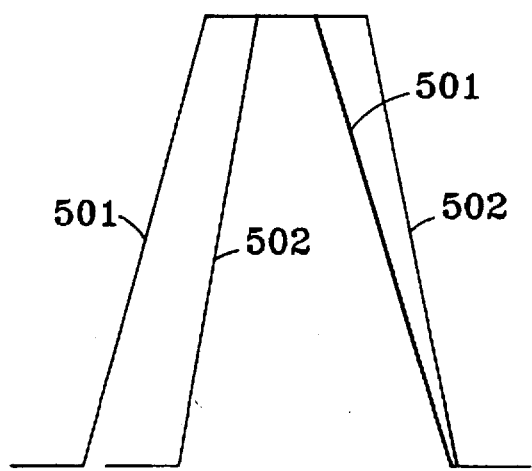
FIGS. 6a–6b illustrate the back-scattered electron-beam signals for several tilted beam configurations.
Figure 6B:
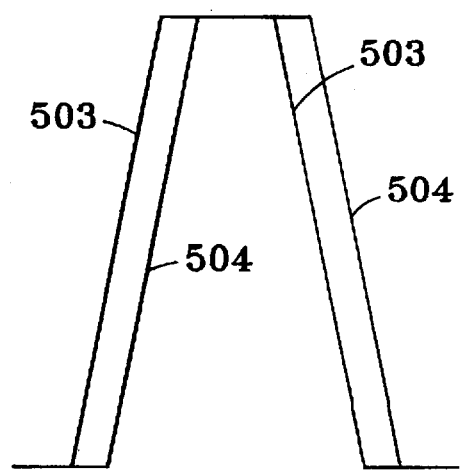

As shown in FIG. 3, the upper and lower alignment coils 110 and 120, respectively, were set such that the beam pivots about the center of the column projection lens. The amplitude of the square wave toggle scan was set so that the traces at positions 401 and 402 are displayed simultaneously on the calibration scan monitor. The differentiated back-scattered signals were photographed for a variety of tilt gain conditions incident angle 410 to see if the resolution of the beam differed between 401 and 402. This data is schematically illustrated in FIG. 6, wherein FIG. 6a shows a mis-adjusted tilt gain, e.g., one trace has a significantly worse edge slope than the other, e.g., transitions times 501 compared to 502, whereas in FIG. 6b both traces, namely, transitions 503 and 504 have a nearly identical resolution. Of course, the sensitivity of this method is enhanced with a larger amplitude of the square-wave toggle scan.

While this invention has been particularly shown and described with reference to several embodiments, it will be understood by those skilled in the art that various changes in form and detail may be made therein without departing from the spirit and scope of the invention.

What is claimed is:

1. A method for improving a resolution of a charged-particle beam lithographic system, said system having at least two alignment deflectors for adjusting an incident angle of the charged particle beam scanning a target, the method comprising the steps of:

a) aligning said charged particle beam into the center of a lens to produce a nominal tilt angle of said charged particle beam with respect to an optical axis of said lens;

b) pivoting said charged particle beam about the center of said lens by a double deflection of said charged particle beam alignment;

c) determining the resolution of said charged particle beam while said charged particle beam scans across said target;

d) applying a square wave toggle to said nominal tilt angle to generate a two-state pivot angle; and e) adjusting said nominal tilt angle until the resolution of said charged particle beam is identical for both states of said two-state pivot angle.

2. The method as recited in step a) of claim 1, wherein said charged particle beam is aligned by telecentric alignment.

3. The method as recited in claim 1, wherein said alignment deflectors are selected from the group that includes magnetic deflectors and electric deflectors.

4. The method as recited in claim 1, wherein said lithographic system is provided with multiple deflectors, and wherein at least a first of said deflectors aligns the beam into the center of said lens, and at least a second and a third of said deflectors pivot around the center of said lens.

5. The method as recited in step e) of claim 1, further comprising the steps of:

scanning said charged particle beam over said target simultaneous with toggling said nominal tilt angle, thereby enabling the observation of the resolution of said two states of said nominal tilt simultaneously.

6. The method as recited in step a) of claim 1, further comprising the steps of:

i) wobbling said lens by altering an excitation of said lens while scanning said charged particle beam over said target along a first axis of said target;

ii) recording a back-scattered or transmitted charged particle beam as a function of a scan voltage as said charged particle beam scans across said target, said scanning resulting in a recording curve having a slope;

iii) determining an alignment of said charged particle beam by measuring a position at any point on said slope of said recording curve;

iv) adjusting said alignment of said charged particle beam to minimize a motion of said recording curve; and v) repeating steps i) through iv) for scanning said charged particle beam over said target along a second axis that is orthogonal to said first axis.

7. The method as recited in claim 1, wherein said lithographic system is provided with multiple deflectors, and wherein a pair of said multiple deflectors aligns said charged particle beam into the center of said lens and pivots said charged particle beam about the center of said lens.

8. A method for improving a resolution of a variable axis lens (VAL) charged particle beam lithographic system, said system having a plurality of alignment deflectors, the method comprising the steps of:

a) deflecting said charged particle beam off an optical axis of a lens and shifting said lens in synchronous with said deflection;

b) aligning said charged particle beam into the center of said shifted lens to produce a nominal tilt angle of said charged particle beam with respect to the optical axis of said shifted lens;

c) pivoting said charged particle beam about the center of said shifted lens by a double deflection of said charged particle beam alignment;

d) determining the resolution of said charged particle beam while said charged particle beam scans across a target;

e) applying a square wave toggle to said nominal tilt angle to generate a two state pivot angle; and f) adjusting said nominal tilt angle until the resolution of said charged particle beam is identical for both states of said two-state pivot angle.

9. A method for improving a resolution of a variable axis immersion lens (VAIL) charged particle beam lithographic system, said system having a plurality of alignment deflectors, the method comprising the steps of:

a) deflecting said charged particle beam off an optical axis of said lens and shifting said lens in synchronous with said deflection;

b) aligning said charged particle beam into the center of said shifted lens to produce a nominal tilt angle of said charged particle beam with respect to the optical axis of said shifted lens;

c) pivoting said charged particle beam about the center of said shifted lens by a double deflection of said charged particle beam alignment;

d) measuring the resolution of said charged particle beam while said charged particle beam scans across a target;

e) applying a square wave toggle to said nominal tilt angle to generate a two state pivot angle; and f) adjusting said nominal tilt angle until the resolution of said charged particle beam is identical for both states of said two-state pivot angle.

* * * * *